(12) United States Patent
Lin et al.

(10) Patent No.: US 6,169,298 B1
(45) Date of Patent: Jan. 2, 2001

(54) SEMICONDUCTOR LIGHT EMITTING DEVICE WITH CONDUCTIVE WINDOW LAYER

(75) Inventors: Ying-Fu Lin, Miao Li; Liang-Tung Chang, Hsinchu; Shiang-Peng Cheng, Chu Pei; Kuan-Chu Kuo, Hsi Kang Hsiang; Chiao-Yun Lin, Hsinchu; Fu-Chou Liu, Chu Pei, all of (TW)

(73) Assignee: Kingmax Technology Inc., Hsinchu (TW)

( * ) Notice: Under 35 U.S.C. 154(b), the term of this patent shall be extended for 0 days.

(21) Appl. No.: 09/131,727

(22) Filed: Aug. 10, 1998

(51) Int. Cl.[7] .................................................... H01L 33/00
(52) U.S. Cl. ......................... 257/103; 257/105; 257/186
(58) Field of Search .............................. 257/186, 39, 105, 257/85, 103

(56) References Cited

U.S. PATENT DOCUMENTS 5,563,422 * 10/1996 Nakamura et al. .
5,614,734 * 3/1997 Guido .
5,739,553 * 4/1998 Noto et al. .
5,760,422 * 6/1998 Ishinaga .

* cited by examiner

Primary Examiner—Stephen D. Meier
(74) Attorney, Agent, or Firm—Harness, Dickey & Pierce, P.L.C.

(57) ABSTRACT

A semiconductor light emitting device, such as the light emitting diode (LED) or the laser diode (LD), having a structure in which a light emitting area is a double heterostructure or a multi-layer quantum well structure. The light emitting area is formed on a substrate. Subsequently, an electrically conductive oxide layer as a transparent window layer to eliminate the crowding effect is formed on the light emitting area. The substrate layer consists of a GaAs substrate and a GaAsP layer to increasing the band gap energy of the substrate. The electrically conductive oxide layer is formed of AlZnO(x) material, having a lower electrical resistivity and a high transparency in the visible wavelength region. The window layer is formed using a physical vapor deposition or a metalorganic chemical vapor deposition.

19 Claims, 3 Drawing Sheets

SEMICONDUCTOR LIGHT EMITTING DEVICE WITH CONDUCTIVE WINDOW LAYER

FIELD OF THE INVENTION

The present invention relates in general to a semiconductor light emitting device, and more particularly, to a semiconductor light emitting device using an electrically conductive oxide as a transparent window layer.

BACKGROUND OF THE INVENTION

The basic principle of the light emitting diode is released light when a electron and a hole are coupled. In the PN junction, electrons and holes are injected into P and N areas respectively under forward bias. These carries of electrons and holes in the depletion region of the PN junction are recombined and the energy is released in the form of light.

The conventional light emitting AlGaInP that is double heterostructure includes an n-type GaAs substrate, a lower n-type AlGaInP cladding layer formed on the top of the substrate, an AlGaInP active layer formed on the cladding layer, and an upper p-type AlGaInP cladding layer formed on the active layer. The light emitting devices are applied to fabricate the light emitting diode in visible wavelength between 680 nm and 550 nm while changing the ratio of aluminum and gallium in the active layer. The cladding layers can confine the carriers in the active layer to increase light emitting efficiency.

In recent years, many investigations into improving the structure and technology are proposed to increase the brightness and efficiency of the light emitting diode. For example, a conductive window layer is formed on the top of the double heterostructure to increase the current spreading. The conventional double heterostructure in the active layer is replaced by a multi-layer quantum well structure to increase the brightness of the light emitting diode and for smoothing the linear relation between light emitting power and current.

In the prior art, U.S. Pat. No. 5,008,718 a light emitting diode is proposed (see particularly FIG. 1). The structure of the proposed light emitting diode is consists of an n-type GaAs substrate 10, a lower n5 type AlGaInP cladding layer 11, an undoped AlGaInP active layer 12, a upper p-type AlGaInP cladding layer 13, a window layer 14, a back electrode 15, and a front electrode 16. The basic feature of the patent is to form a window layer of low resistivity, excellent conductivity, and having an energy band gap greater than the energy band gap of the active layer on the top of p-type AlGaInP cladding layer to reduce the current crowding effect.

Suitable materials for producing a window layer are AlGaAs, GaAsP, and GaP, wherein the lattice parameter of the AlGaAs that is used to fabricating the light emitting diode in the wavelength from the red to the yellow region is lattice matched with the GaAs substrate. The GaAsP and GaP with greater energy band gap are suitable to fabricate a window layer of the light emitting diode in the region of shorter wavelength. The disadvantage of the materials lattice mismatched with the substrate effect the operation life of the device. The device is grown by two steps. First, the AlGaInP double heterostructure is formed by metalorganic vapor phase epitaxy (MOVPE) second, a thick window layer is formed on the DH structure by vapor phase epitaxy (VPE). However, this method increases the process complexity and the time required for fabricating the device.

Referring to FIG. 2, due to the fact that the energy band gap of a GaAs substrate is smaller than the energy band gap of the AlGaInP active layer, the light released from a active layer will be adsorbed almost by the GaAs substrate. U.S. Pat. No. 5,376,580 has proposed another structure to increase the light emitting efficiency. The structure includes an n-type GaP substrate 20, a n-type lower AlGaInP cladding layer 21, an undoped AlGaInP active layer 22, a p-type upper AlGaInP cladding layer 23, a p-type GaP window layer 24, a front electrode 25, and a back electrode 26. The feature is to etch the GaAs substrate like as the structure of the light emitting diode in FIG. 1 by chemical etching, leaving an epitaxy layer having a thickness of about 50 $\mu$m. Bonding a GaP substrate having a thickness of about 350 $\mu$m to the epitaxy layer by wafer bonding technology forms a AlGaInP light emitting diode having a transparent substrate. However, the method must result in a thin film of 50 $\mu$m and avoid to breaking the film, the yield is not good due to process difficulties.

One of the references related to the light emitting diode can be seen in U.S. Pat. No. 5,481,122. Referring to FIG. 3 of that patent, the same layers can be seen in FIG. 1 with the same labels. The feature of the patent in the GaP window layer is replaced by a p-type contact layer 31 and a conductive oxide window layer 32, wherein GaAsP, GaP, or GaAs is used to form the p-type contact layer 31. The oxide for forming the transparent window layer 32 could be tin oxide, indium oxide, or indium tin oxide (ITO). The transmittance is about 90% for light wavelength in the visible region. Furthermore, the electrical resistivity is only about $3 \times 10^{-4}$ $\Omega$-cm, that is a thousandth resistivity of the p-type AlGaInP and a hundredth resistivity of the p-type GaP.

In view of the present situation, a need has arisen to develop a semiconductor light emitting device for increasing output power, and furthermore, to overcome the disadvantages of the conventional approaches.

SUMMARY OF THE INVENTION

An object of the present invention is to provide a high efficiency semiconductor light emitting device.

Another object of the present invention is to provide a high efficiency semiconductor light emitting device having an electrically conductive oxide layer as a transparent window layer.

According to the invention, a semiconductor light emitting device comprises:
a substrate consisting of a GaAs substrate and a GaAsP layer;
a light emitting layer comprising a first cladding layer, an active layer and a second cladding; and
a windowing layer forming of AlZnO(x) material.

A semiconductor light emitting device, such as the light emitting diode (LED) or the laser diode (LD), includes a first conductivity type GaAs substrate and a first conductivity type GaAsP layer which is formed on the top of the substrate to increase the band gap energy of the substrate. A first conductivity type distributed Bragg reflector layer is formed on the GaAsP layer. An AlGaInP double heterostructure including a first cladding AlGaInP layer of the first conductivity type, an undoped active AlGaInP layer, and a second cladding AlGaInP layer of the second conductivity type is grown on the top of the distributed Bragg reflector layer. The undoped active AlGaInP layer can also be replaced by a multi-layer quantum well structure of AlGaInP. A second conductivity type layer of low energy band gap and high conductivity material is formed on the AlGaInP double heterostructure. A AlZnO(x) window layer of the second conductivity type is then formed on the top of the low energy band gap layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
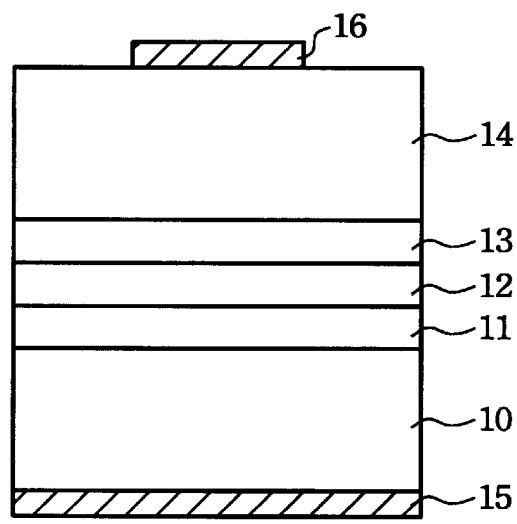
FIG. 1 is a cross-sectional view of the structure of the first prior art light emitting diode.
Figure 2:
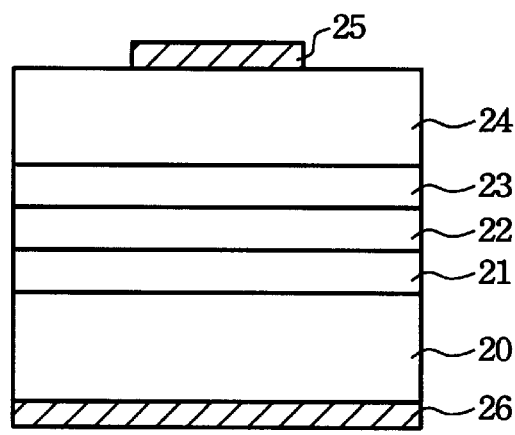
FIG. 2 is a cross-sectional view of the structure of the second prior art light emitting diode.
Figure 3:
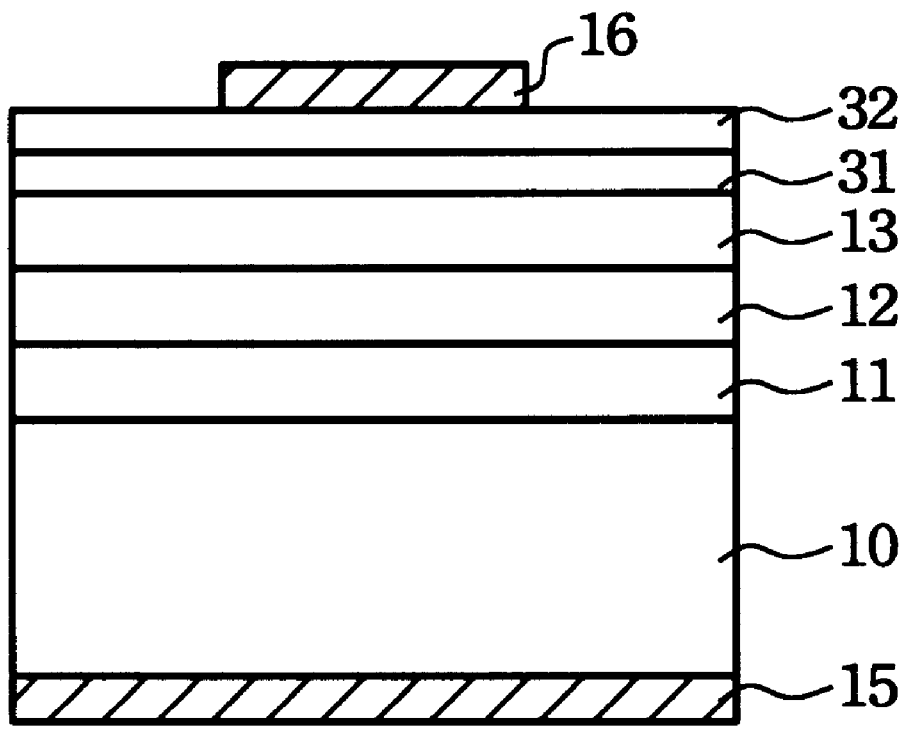
FIG. 3 is a cross-sectional view of the structure of the third prior art light emitting diode.
Figure 4:
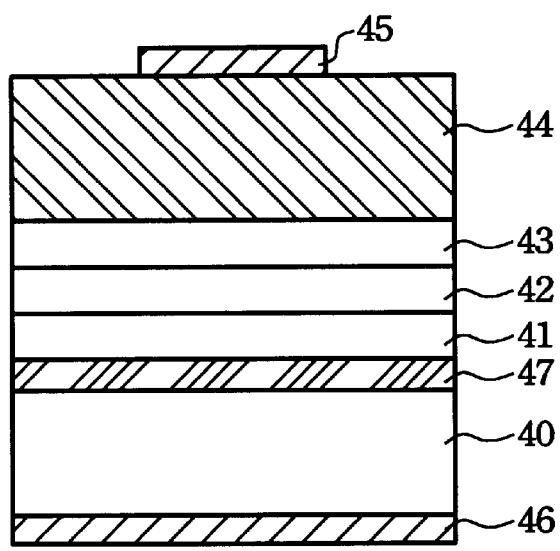
FIG. 4 is a cross-sectional view of the structure of the first preferred embodiment of the present invention semiconductor light emitting device.

A cross-sectional view of the present invention is shown in FIG. 4. The substrate 40 of the present invention can be n-type GaAs, n-type GaAsP on n-type GaAs, or n-type GaAsP on n-type GaP. The layer of n-type GaAsP 47 is grown directly on the substrate 40 by metalorganic vapor phase epitaxy (MOVPE) and used for increasing the energy band gap of the substrate. The thickness of the substrate 40 is in the range of between 300 to 350 µm, and the thickness of the n-type GaAsP 47 layer is in the range of 0.5 to 15 µm. A first cladding layer of an n-type AlGaInP 41 is formed on the n-type GaAsP layer 47, and the above of the n-type AlGaInP 41 is an active layer of undoped AlGaInP 42. A second cladding p-type AlGaInP 43 is then grown on top of the active layer 42. All of the three layers are sequentially grown by the MOVPE method. In the structure of the present invention, the undoped AlGaInP active layer 42 can be replaced by an AlGaInP multi-layer quantum well structure.

To form a window layer of the semiconductor light emitting device of this invention, a layer of AlZnO(x) 44 is formed on top of the p-type AlGaInP cladding layer 43 using physical vapor deposition (PVD) or metalorganic chemical vapor deposition (MOCVD) technology. The temperature of growing a transparent window layer 44 of AlZnO(x) is lower than 300° C. An n-type electrode 46 is deposited on the backside surface of the wafer substrate. A p-type electrode 45 is deposited on the AlZnO(x) window layer 44.

The AlZnO(x) layer 44 is completely lattice matched with the p-type AlGaInP cladding layer 43 and has a thickness in the range of 0.1 to 10 µm. The transmittance is more than 80% for light wavelength in the visible region. In addition, the transparent window layer will not absorb photons emitted from the active PN junction layers. Furthermore, the electrical resistivity of the transparent window layer is only about $1.34 \times 10^{-4}$ Ω-cm. Accordingly, the injected current may substantially spread out through the entire device, thereby contributing to high power output.

Figure 5:
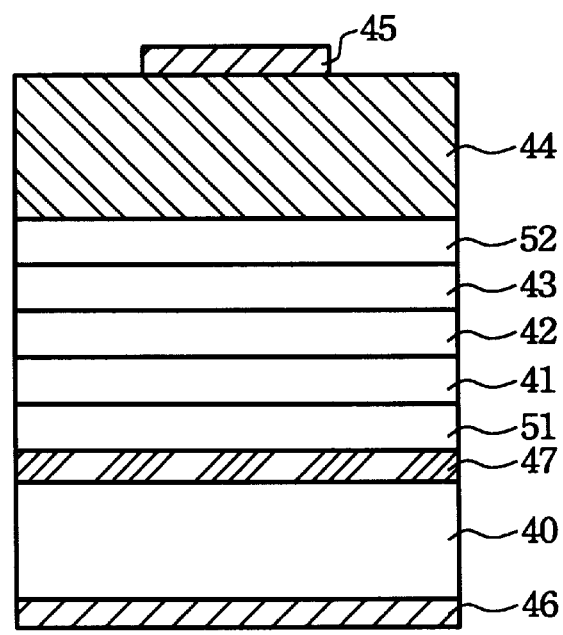
FIG. 5 is a cross-sectional view of the structure of the second first preferred embodiment of the present invention semiconductor light emitting device.

Another preferred embodiment of the present invention is shown in FIG. 5, while the same layers may be seen in FIG. 4 with the same labels. An n-type distributed Bragg reflector (DBR) layer 51 is grown above the substrate 47. The thickness of the reflector layer 51 is a quarter wavelength of the light wave emitted by the device. Its material can be multi-layered crystal and comprises AlAs on AlGaAs or AlInP on AlGaInP. A first cladding layer of n-type AlGaInP 41 is formed on the DBR layer 51, and above the n-type AlGaInP 41 is an active layer of undoped AlGaInP 42. A second cladding p-type AlGaInP 43 is then grown on top of the active layer 42. A p-type ohmic contact layer 52 is formed on top of the p-type AlGaInP second cladding layer 43, subsequently, a window layer 44 of AlZnO(x) is grown above th ohmic contact layer 52. GaAs, GaAsP, or GaP is used to form the ohmic contact layer 52. An n-type electrode 46 is deposited on the backside surface of the wafer substrate. A p-type electrode 45 is deposited on the AlZnO(x) window layer 44.

As is understood by a person skilled in the art, the foregoing preferred embodiments of the present invention are illustrative of the present invention rather than limiting of the present invention. They are intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

What is claimed is:

1. A semiconductor light emitting device comprising:
   a substrate of a first conductivity type on a first conductivity type electrode;
   a double heterostructure (DH) of AlGaInP on the substrate;
   a conductive transparent window layer of AlZnO(x) on the DH structure; and
   a second conductivity type electrode formed on a part of said window layer.

2. The semiconductor light emitting device according to claim 1, wherein said substrate comprises gallium arsenide.

3. The semiconductor light emitting device according to claim 1, wherein said substrate comprises gallium arsenide phosphide on gallium arsenide.

4. The semiconductor light emitting device according to claim 1, wherein said substrate comprises gallium arsenide phosphide on gallium phosphide.

5. The semiconductor light emitting device according to claim 1, further comprising a distributed Bragg reflector (DBR) of said first conductivity type lying between said substrate and said AlGaInP DH structure.

6. The semiconductor light emitting device according to claim 1, further comprising a ohmic contact layer of said second conductivity type lies between said AlGaInP DH structure and said conductive transparent window layer.

7. The semiconductor light emitting device according to claim 5, wherein said DBR layer comprises aluminum arsenide on aluminum gallium arsenide.

8. The semiconductor light emitting device according to claim 5, wherein said DBR layer comprises aluminum indium phosphide on aluminum gallium indium phosphide.

9. A semiconductor light emitting device comprising:
   a substrate of a first conductivity type on a first conductivity type electrode;
   a multi-layer quantum well structure (MQW) of AlGaInP on the substrate;
   a conductive transparent window layer of AlZnO(x) on the MQW structure; and
   a second conductivity type electrode formed on a part of said window layer.

10. A semiconductor light emitting device comprising:

a substrate of a first conductivity type on a first conductivity type electrode;

a first cladding layer of a first conductivity type AlGaInP on the substrate;

an undoped AlGaInP active layer on the first cladding layer;

a second cladding layer of a second conductivity type AlGaInP on the undoped active layer;

a conductive transparent window layer of AlZnO(x) on the second cladding layer; and a second conductivity type electrode formed on a part of said window layer.

11. The semiconductor light emitting device according to claim 10, wherein said substrate comprises gallium arsenide.

12. The semiconductor light emitting device according to claim 10, wherein said substrate comprises gallium arsenide phosphide on gallium arsenide.

13. The semiconductor light emitting device according to claim 10, wherein said substrate comprises gallium arsenide phosphide on gallium phosphide.

14. The semiconductor light emitting device according to claim 10, further comprising a distributed Bragg reflector (DBR) of said first conductivity type lies between said substrate and said first cladding layer.

15. The semiconductor light emitting device according to claim 10, further comprising a ohmic contact layer of said second conductivity type lies between said second cladding layer and said conductive transparent window layer.

16. The semiconductor light emitting device according to claim 14, wherein said DBR layer comprises aluminum arsenide on aluminum gallium arsenide.

17. The semiconductor light emitting device according to claim 14, wherein said DBR layer comprises aluminum indium phosphide on aluminum gallium indium phosphide.

18. The semiconductor light emitting device according to claim 10, wherein said undoped AlGaInP active layer is double heterostructure.

19. The semiconductor light emitting device according to claim 10, wherein said undoped AlGaInP active layer is multi-layer quantum well structure.

* * * * *